United States Patent
Kato

(10) Patent No.: US 7,509,603 B2
(45) Date of Patent: Mar. 24, 2009

(54) SEMICONDUCTOR INTEGRATED CIRCUIT AND DESIGN METHOD THEREOF

(75) Inventor: Kiyoshi Kato, Kanagawa (JP)

(73) Assignee: Semiconductor Energy Laboratory Co., Ltd., Atugi-shi, Kanagawa-ken (JP)

( * ) Notice: Subject to any disclaimer, the term of this patent is extended or adjusted under 35 U.S.C. 154(b) by 261 days.

(21) Appl. No.: 10/595,567

(22) PCT Filed: Oct. 25, 2004

(86) PCT No.: PCT/JP2004/016174

§ 371 (c)(1),
(2), (4) Date: Apr. 27, 2006

(87) PCT Pub. No.: WO2005/043617

PCT Pub. Date: May 12, 2005

(65) Prior Publication Data

US 2007/0130550 A1    Jun. 7, 2007

(30) Foreign Application Priority Data

Oct. 31, 2003    (JP) .............................. 2003-373514

(51) Int. Cl.
*G06F 17/50*    (2006.01)
*G06F 9/45*    (2006.01)

(52) U.S. Cl. .............................................. 716/5; 716/1

(58) Field of Classification Search ............ 716/1, 716/5, 6
See application file for complete search history.

(56) References Cited

U.S. PATENT DOCUMENTS

| | | | |
|---|---|---|---|
| 5,705,829 A | 1/1998 | Miyanaga et al. | |
| 5,939,731 A | 8/1999 | Yamazaki et al. | |
| 6,034,675 A | 3/2000 | Yamazaki | |
| 6,400,360 B1 | 6/2002 | Yamazaki | |
| 6,489,632 B1 | 12/2002 | Yamazaki et al. | |
| 6,624,445 B2 | 9/2003 | Miyanaga et al. | |
| 6,678,645 B1 * | 1/2004 | Rajsuman et al. | ............. 703/20 |
| 6,678,871 B2 | 1/2004 | Takeyama et al. | |

(Continued)

FOREIGN PATENT DOCUMENTS

JP    11-154169    6/1999

OTHER PUBLICATIONS

Buyeol Lee et al.; "A CPU on a Glass Substrate Using CG-Silicon TFTs"; *ISSCC 2003 / Session 9 / TD: Digital Architecture and Systems / Paper 9.4(Digest of Technical Papers)—IEEE International Solid-State Circuits Conference vol. 1*; pp. 164-165; Feb. 11, 2003.

(Continued)

*Primary Examiner*—Stacy A Whitmore
*Assistant Examiner*—Magid Y Dimyan
(74) *Attorney, Agent, or Firm*—Fish & Richardson P.C.

(57) ABSTRACT

A design method of a logic circuit, capable of shortening the design period, is achieved by this invention. A semiconductor integrated circuit has a plurality of logic blocks each of which is constituted by a first logic circuit and a second logic circuit. Such semiconductor integrated circuit is designed in at least two steps: a first design step in which designing layout and timing verification are performed for a logic circuit including signal lines between the logic blocks and the first logic circuit; and a second design step in which layout and timing verification are performed for the second logic circuit in each logic block independently.

8 Claims, 7 Drawing Sheets

U.S. PATENT DOCUMENTS

| | | |
|---|---|---|
| 6,697,059 B2 | 2/2004 | Yamazaki |
| 6,848,095 B1 * | 1/2005 | Lee .............................. 716/17 |
| 6,955,954 B2 | 10/2005 | Miyanaga et al. |
| 6,995,432 B2 | 2/2006 | Yamazaki et al. |
| 7,062,739 B2 * | 6/2006 | Monthie et al. ................. 716/8 |
| 7,127,691 B2 * | 10/2006 | Cruz et al. ..................... 716/5 |
| 7,353,162 B2 * | 4/2008 | Huang et al. ................... 703/23 |
| 2002/0083398 A1 | 6/2002 | Takeyama et al. |
| 2003/0009727 A1 | 1/2003 | Takeyama et al. |
| 2004/0232459 A1 | 11/2004 | Takayama et al. |
| 2004/0238827 A1 | 12/2004 | Takayama et al. |
| 2005/0250266 A1 | 11/2005 | Yamazaki et al. |

OTHER PUBLICATIONS

David Van Campenhout et al.; "Timing Verification of Sequential Dynamic Circuits"; *IEEE Transactions on Computer-Aided Design of Integrated Circuits and Systems*, vol. 18, No. 5; pp. 645-658; May 1999.

International Search Report (Application No. PCT/JP2004/016174) dated Jan. 25, 2005.

Written Opinion (Application No. PCT/JP2004/016174) dated Jan. 25, 2005.

* cited by examiner

SEMICONDUCTOR INTEGRATED CIRCUIT AND DESIGN METHOD THEREOF

This application claims the benefit of priority to Japanese Patent Application No. 2003-373514, filed Oct. 31, 2003.

TECHNICAL FIELD

The present invention relates to a semiconductor integrated circuit capable of being verified systematically, a design method thereof, and a design tool thereof.

BACKGROUND ART

A conventional LSI design method is typically represented by a flowchart as shown in FIG. 2. That is, RTL modeling and logic verification are performed first, and next logic synthesis, layout, and timing verification are performed to generate mask data. Then, a prototype is made and evaluated to ship samples. Problems detected in the verification and evaluation are corrected while being returned to the respective required steps. At present, high performance logic simulators and logic synthesis tools allow logic errors to be eliminated almost completely. However, as for a malfunction caused by timing variations due to parasitic resistance and capacitance generated after the layout, it is much more difficult to be eliminated as compared with errors caused only by logic structures. In general, timing verification is performed after the layout in view of parasitic resistance and capacitance, though multiple modifications of the layout are required, leading to a longer design period of time. In addition, there are errors that cannot be eliminated in the design step because of low accuracy of adjustment.

DISCLOSURE OF INVENTION

A malfunction in the timing verification is typically caused by a long lead wiring, for instance. In such a case, the layout is often required to be widely modified. Furthermore, even when the layout is modified so as to reduce the corresponding wiring capacitance and resistance, another wiring may be formed to cause another malfunction due to timing variations. Thus, the malfunction caused by timing variations due to parasitic resistance and capacitance after the layout is difficult to be systematically corrected, leading to a longer design period of time.

The aforementioned malfunction due to timing variations causes serious problems in the design of an LSI on a glass substrate that has been actively developed in recent years. This is mainly because transistors on a glass substrate generally have larger variations in element characteristics as compared with transistors on a single crystalline silicon substrate, and thus simulation cannot be performed with high accuracy. Therefore, timing verification using a produced chip after making the prototype becomes essential, and more particularly, systematic correction is more required in view of the development period and cost.

In view of the foregoing problems, the invention provides a semiconductor integrated circuit, a malfunction of which due to timing variations can be corrected systematically. The invention also provides a design method of the semiconductor integrated circuit in order to shorten a design period of time. Furthermore, the invention provides a design tool of the semiconductor integrated circuit in order to shorten a design period of time.

In order to correct a malfunction in a logic circuit due to timing variations, the layout is required to be modified either widely or locally. For instance, in the case of correcting a malfunction caused by parasitic capacitance and resistance due to a long wiring, the layout may be locally modified by adding a buffer to increase the drive capability, or may be widely modified in order to shorten the wiring.

The inventor considered that in order to systematically correct a malfunction due to timing variations, it is important to determine whether to modify a chip layout widely or locally, and to reduce malfunctions required to be corrected by widely modifying the chip layout.

It is to be noted that a semiconductor integrated circuit according to the invention is constituted by a plurality of logic blocks as a normal LSI chip. A logic block is a collection of logic circuits having the same function, which includes a lot of logic gates. The designing layout is generally performed for each logic block.

Furthermore, in the invention, a block for generating control signals supplied to a plurality of logic blocks is referred to as a control signal generating circuit to be distinguished from other logic blocks.

It is to be noted that a control signal means a signal for controlling latching of registers, and typically means various clock signals, reset signals, or signals generated based on these signals. On the other hand, a data signal means various signals whose values are stored in registers.

On the basis of the foregoing, a design method of the invention is divided into two steps as shown in FIG. 3. After the normal RTL modeling and logic verification, the first design step is performed, in which a logic circuit is not verified in detail and designing layout and timing verification are performed for a chip outline while taking into consideration, for instance, input signals to each logic block only. In the second design step, designing layout and timing verification are performed for each logic block while maintaining the layout of the chip outline and the input signal timing to each logic block that have been obtained in the first design step. Then, after generating mask data, a prototype is made and evaluated to ship samples. A malfunction detected in each verification and evaluation is corrected while being returned to the respective required steps. The aforementioned two design steps including the one for the chip outline and the one for each logic block provide a design method that can determine whether the correction is required for the chip outline or only for each logic block and can perform systematic correction. In addition, systematic correction can also be performed by using a design tool for executing the first design step and the second design step.

According to the invention, two types of logic circuits for the first design step and the second design step are distinguished as following.

In the first design step, signals between logic blocks and a part of each logic block are designed. The part of each logic block here means a logic circuit including a register for latching an input data signal transmitted to each logic block firstly and a control circuit for controlling the register. The control circuit also generates control signals serving as other control signals used within each logic block. In the invention, this part is referred to as a first logic circuit whereas other part within the logic block is referred to as a second logic circuit. Further, a group of registers for latching an input data signal transmitted to each logic block firstly is referred to as a first group of registers whereas a group of registers included in the second logic circuit is referred to as a second group of registers.

Such a structure is shown in FIG. 1. In FIG. 1, a logic block 101 is constituted by a first logic circuit 102 and a second logic circuit 103, input data 107 and an input control signal 108 being input thereto, and output data 109 and an output control signal 110 being output therefrom. The first logic circuit 102 includes a logic circuit 105 with no latches, a first group of registers 104, and a control circuit 106. The second logic circuit 103 includes a second group of registers and a control circuit for controlling the second group of registers (not shown).

That is, in the first design step, designing layout and timing verification are performed for the outline of logic circuit that includes signal lines between logic blocks and each of the first logic circuits. Next, in the second design step, designing layout and timing verification are performed for the second logic circuit 103 in each logic block independently, in accordance with the layout and timing obtained in the first design step.

As a result, a malfunction of an incorrect value stored in the first group of registers 104 may be corrected while being returned to the first design step. In that case, the layout of a plurality of logic blocks may be required to be modified. On the other hand, as for a malfunction of an incorrect value stored only in the second group of registers, the second design step may be performed for the second logic circuit 103 in the corresponding logic circuit 101. In that case, the result of the first design step is not modified and another malfunction does not occur except in the corresponding second logic circuit 103, therefore, the layout can be locally modified. Thus, systematic correction can be performed by correcting malfunctions in the first group of registers 104 first, and then correcting malfunctions in the second group of registers.

A semiconductor integrated circuit manufactured by the design method of the invention comprises logic blocks in each of which a first logic circuit and a second logic circuit are disposed separately. In other words, a layout including a plurality of parts each of which can be corrected independently is achieved, which allows more efficient correction of the layout.

In this manner, a shorter design period of time can be achieved.

Described hereinafter is a more efficient design method of the invention.

A malfunction due to the first design step requires the correction of a plurality of logic blocks in many cases. Therefore, it is important to reduce such malfunctions. In order to reduce such malfunctions, timing verification is preferably performed more accurately and a circuit scale in the timing verification is preferably reduced as much as possible. For instance, a structure in which an input data signal is directly stored in a register of each logic block not through a logic gate in a logic circuit may be adopted.

In addition, it is also important to adopt a structure in which a malfunction due to the first design step can be corrected by locally modifying the layout. For instance, a structure in which a control signal in a logic block is controlled independently of other logic blocks and control signal timing can be adjusted in each logic block may be adopted.

According to the design method of the invention including two design steps, a malfunction due to timing variations can be systematically corrected by determining which of the design steps causes the malfunction. Furthermore, a semiconductor integrated circuit manufactured by the design method of the invention has a layout divided into a plurality of parts each of which can be corrected independently, which allows an efficient correction of the layout. As a result, a shorter design period of time can be achieved.

BEST MODE FOR CARRYING OUT THE INVENTION

Figure 1:
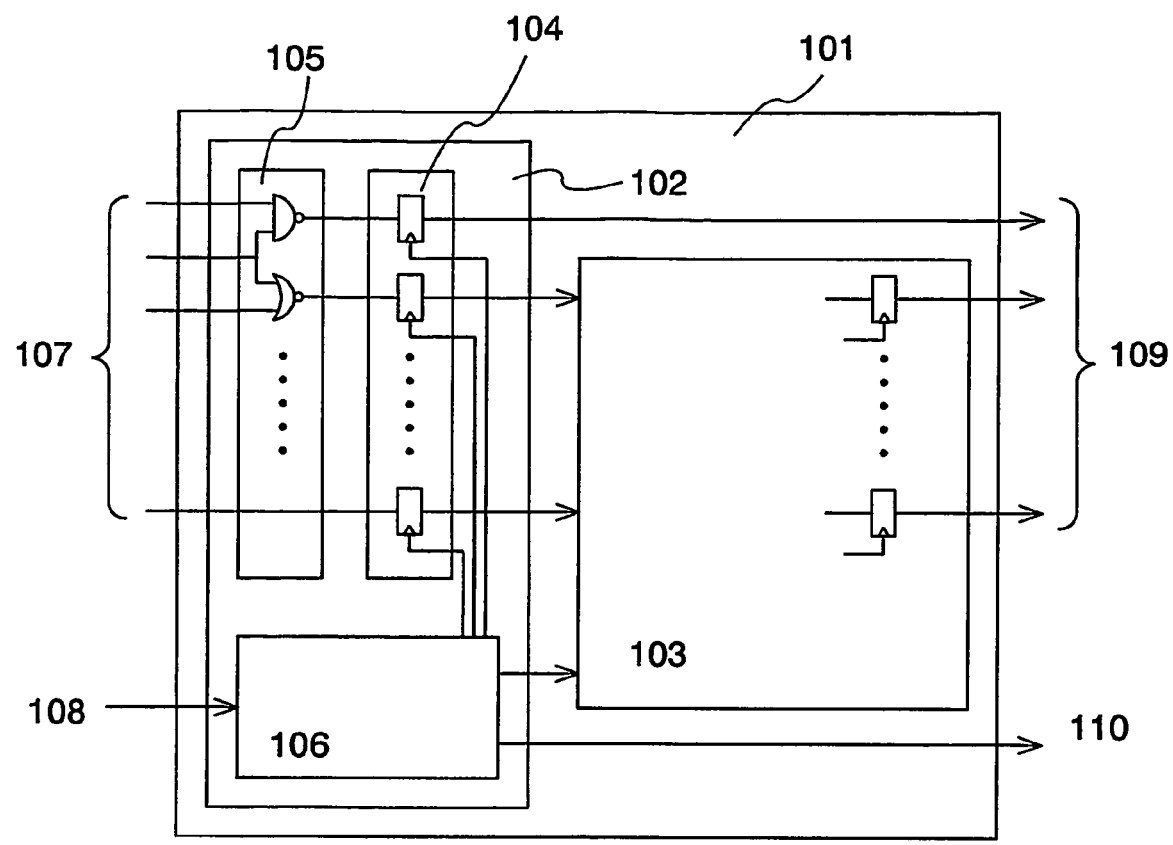
FIG. 1 is a block diagram showing a logic block constituting a semiconductor integrated circuit of the invention.
Figure 2:
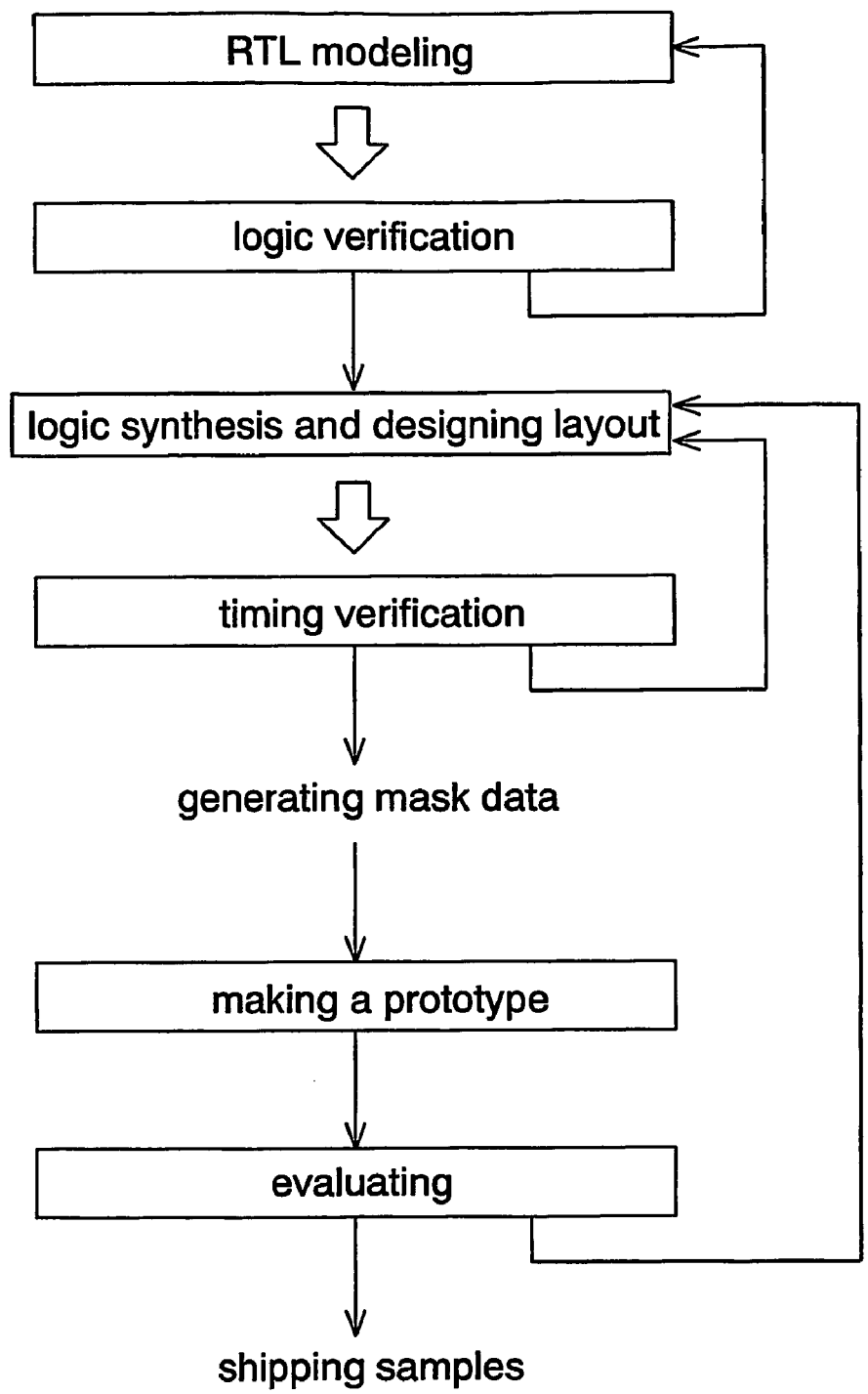
FIG. 2 is a conventional design flowchart.
Figure 3:
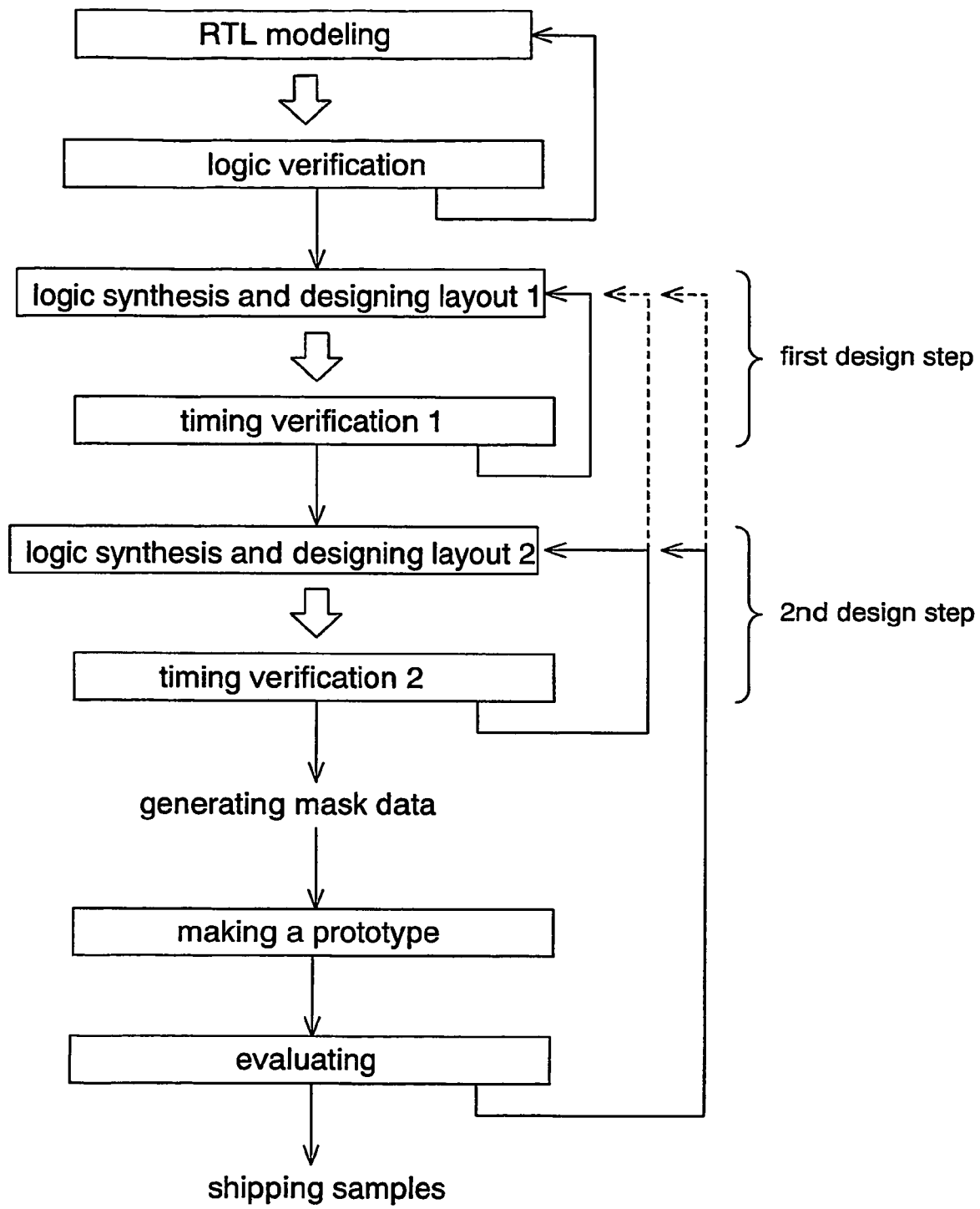
FIG. 3 is a design flowchart of the invention.
Figure 4:
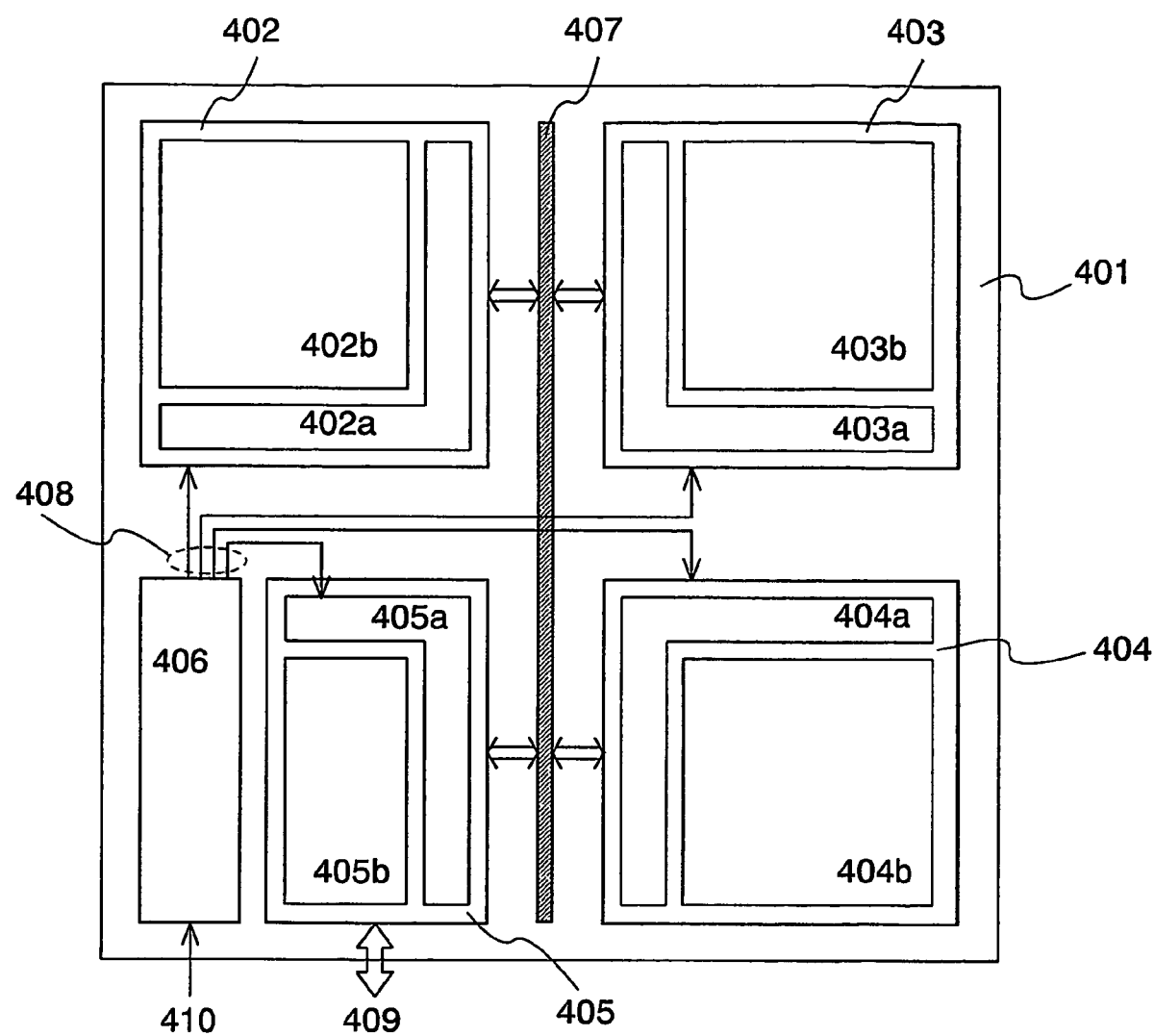
FIG. 4 is a block diagram showing a semiconductor integrated circuit of the invention.

A design method of the invention is described hereinafter. FIG. 4 is a block diagram of a typical semiconductor integrated circuit. A semiconductor integrated circuit 401 is constituted by logic blocks 402 to 405, a control signal generating circuit 406, data lines 407, and control lines 408. An input control signal 410 and input and output data 409 are input to or output from the semiconductor integrated circuit 401. Each of the logic blocks 402 to 405 is divided into first logic circuits 402a to 405a and second logic circuits 402b to 405b respectively. It is needless to say that the number of logic blocks and the structure of data lines are just examples and the invention is not limited to these.

According to a design method of the invention, in the first design step, designing layout and timing verification are performed for the control signal generating circuit 406, the data lines 407, the control lines 408, and the first logic circuits 402a to 405a. Note that the control signal generating circuit 406 is a block for generating control signals supplied to a plurality of logic blocks, thus, it is preferably considered in the first design step for determining the layout of a chip outline.

For instance, a required layout area can be estimated from the number of elements included in each of the first logic circuits 402a to 405a and the second logic circuits 402b to 405b. On the basis of this estimation, layout is made for the control signal generating circuit 406, the data lines 407, the control lines 408, and the first logic circuits 402a to 405a. Subsequently, timing verification is performed by the use of capacitance value and resistance value extracted from the obtained layout. In the first design step, consideration is made on registers in each logic block to which signals have just been input. This step is intended to verify the timing of the data lines 407 and the control lines 408 that are signal lines connected to a plurality of logic blocks.

When an operation is verified, the first design step is completed. In the case of a malfunction being detected, designing layout and timing verification are performed again.

In the second design step, designing layout and timing verification are performed for the second logic circuits 402b to 405b. In this design step, designing layout and timing verification can be performed for each of the second logic circuits 402b to 405b independently. The layout is made so as to be connected to the layout obtained in the first design step. The timing verification is performed while maintaining the timing verified in the first design step. When an operation is verified, the second design step is completed. In the case of a malfunction being detected, designing layout and timing verification are performed again for the corresponding second logic circuit.

As the result of this design method, a layout of a semiconductor integrated circuit, in which a first logic circuit and a second logic circuit are disposed separately, can be achieved.

According to such a layout, a malfunction due to timing variations can be systematically corrected, resulting in a shorter design period of time.

Specifically, for instance, it is supposed that a malfunction of an incorrect value stored in a register in the logic block 402 is detected in the verification of a produced chip obtained on the basis of the semiconductor integrated circuit shown in FIG. 4. In that case, it is checked whether the detected malfunction is included in a register in the first logic circuit 402*a*, namely the first group of registers, or a register in the second logic circuit 402*b*, namely the second group of registers.

In the case of the malfunction being included in the first group of registers, it is corrected while being returned to the first design step, which may require the correction of the layout of a plurality of logic blocks. On the other hand, in the case of the malfunction being included only in the second group of registers, it is corrected while being returned to the second design step. In the latter case, designing layout and timing verification may be performed only for the corresponding second logic circuit 402*b*. In particular, one of the features of the invention is that the second logic circuit 402*b* is separated from the first logic circuit 402*a* on the layout. According to this, only the layout of the second logic circuit may be modified.

As set forth above, systematic correction can be performed by correcting malfunctions up to the first group of registers first, and then correcting malfunctions in the second group of registers. Accordingly, a shorter design period of time can be achieved.

In addition, systematic correction can also be performed by using a design tool for executing the aforementioned first design step and second design step, resulting in a shorter design period of time.

EMBODIMENT 1

In the case of a large scale integrated circuit, each logic block includes much larger number of elements. For instance, in the case of a chip having one million to ten millions logic gates, each logic block includes hundreds of thousands to one million logic gates. In such a case, the layout is required to be widely modified even when the second logic circuit has only to be corrected.

In the case of a large scale integrated circuit, each logic block is further divided into a plurality of logic sub-blocks in general. A logic sub-block is a collection of logic circuits having the same function, and the layout is normally made for each logic sub-block.

A systematic design method of the invention can be applied to an integrated circuit having such sub-blocks as well. That is, as described below, the second design step may be divided into the third design step and the fourth design step, and the second logic circuit may be divided into the third logic circuit and the fourth logic circuit.

In the third design step, signals between logic sub-blocks and a part of each logic sub-block are designed. The part of each logic sub-block here includes a register for latching an input data signal transmitted to each logic sub-block firstly and a control circuit for controlling the register. The control circuit also generates control signals serving as other control signals used within each logic sub-block. In the invention, this part is referred to as a third logic circuit whereas the other part within the logic sub-block is referred to as a fourth logic circuit. Further, a group of registers for latching an input data signal transmitted to each logic block firstly is referred to as a third group of registers whereas a group of registers included in the fourth logic circuit is referred to as a fourth group of registers.

In the third design step, designing layout and timing verification are performed for signals between logic sub-blocks and all the third logic circuits. Next, in the fourth design step, designing layout and timing verification are performed for the fourth logic circuit in each logic sub-block independently, in accordance with the layout and timing obtained in the third design step. Such a design method allows to determine which of the third design step and the fourth design step causes a malfunction in the second logic circuit due to timing variations, and thus systematic correction can be performed.

Figure 5:
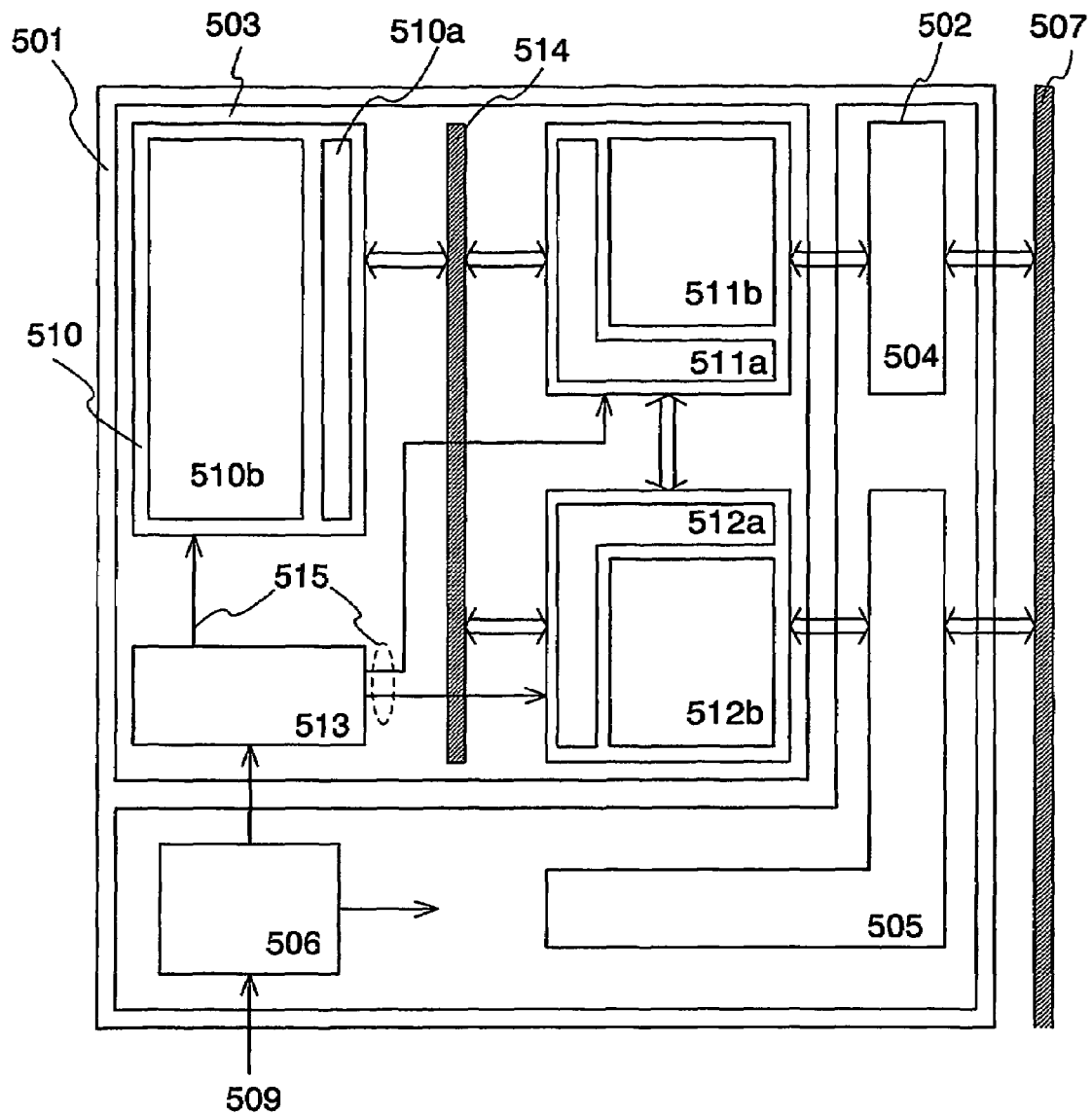
FIG. 5 is a block diagram showing a logic block constituting a semiconductor integrated circuit of the invention.

FIG. 5 shows a typical example of a logic block that includes sub-blocks. Signals are input to or output from a logic block 501 through control lines 509 and data lines 507. The logic block 501 is constituted by a first logic circuit 502 including first groups of registers 504 and 505 and a control circuit 506, and a second logic circuit 503. The second logic circuit 503 is constituted by data lines 514, control lines 515, logic sub-blocks 510 to 512, and a control circuit 513. Each of the logic sub-blocks 510 to 512 is divided into third logic circuits 510*a* to 512*a* and fourth logic circuits 510*b* to 512*b*. It is needless to say that the number of logic blocks and the structure of data lines are just examples and the invention is not limited to these.

According to a design method of the invention, the third design step is performed after the first design step, in which designing layout and timing verification are performed for the control circuit 513, the data lines 514, the control lines 515, and the third logic circuits 510*a* to 512*a*. For instance, a required layout area can be estimated from the number of elements included in each of the third logic circuits and the fourth logic circuits. On the basis of this estimation, layout is made for the control circuit 513, the data lines 514, the control lines 515, and the third logic circuits 510*a* to 512*a*. Subsequently, timing verification is performed by the use of capacitance values and resistance values extracted from the obtained layout. In the third design step, consideration is made on registers in each logic block to which signals have just been input. This step is intended to verify the timing of the data lines 514 and the control lines 515 that are signal lines connected to a plurality of logic sub-blocks.

When an operation is verified, the third design step is completed. In the case of a malfunction being detected, designing layout and timing verification are performed again.

In the fourth design step, designing layout and timing verification are performed for each of the fourth logic circuits 510*b* to 512*b*. In this design step, designing layout and timing verification can be performed for each of the fourth logic circuits independently. The layout is made so as to be connected to the layout obtained in the third design step. The timing verification is performed while maintaining the timing verified in the third design step. When an operation is verified, the fourth design step is completed. In the case of a malfunction being detected, designing layout and timing verification are performed again for the corresponding fourth logic circuit.

When a malfunction due to timing variations is detected in a semiconductor integrated circuit designed in this manner, it can be systematically corrected as described below.

A malfunction of an incorrect value stored in the third group of registers may be corrected while being returned to the third design step, which may require the correction of the layout of a plurality of logic sub-blocks. On the other hang, in the case of a malfunction of an incorrect value stored only in the fourth group of registers, only the fourth logic circuit in the corresponding logic sub-block may be corrected while being returned to the fourth design step. In the latter case, the results of the first and the third design steps are not modified and another malfunction does not occur except in the corresponding fourth logic circuit, therefore, the layout can be locally modified. Thus, systematic correction can be performed by correcting malfunctions in the third group of registers first, and then correcting malfunctions in the fourth group of registers. As a result, a shorter design period of time can be achieved.

According to the design method of the invention, the layout of a logic block includes the third logic circuit and the fourth logic circuit that are disposed separately. Therefore, the layout of only either the third logic circuit or the fourth logic circuit can be easily modified by the use of an automatic placement and routing tool and the like. As described above, the layout including a plurality of parts each of which can be corrected independently allows efficient correction of the layout, thus it is preferable.

In addition, layout correction can also be efficiently performed by the use of a design tool for executing the aforementioned first design step, third design step and fourth design step.

EMBODIMENT 2

A malfunction due to the first design step requires the correction of an entire chip in many cases. Therefore, it is important to perform timing verification more accurately. For instance, a structure in which an input data signal input to each logic block is directly stored in the first group of registers not through a logic gate may be adopted as a circuit structure for reducing malfunctions due to the first design step.

Figure 6:
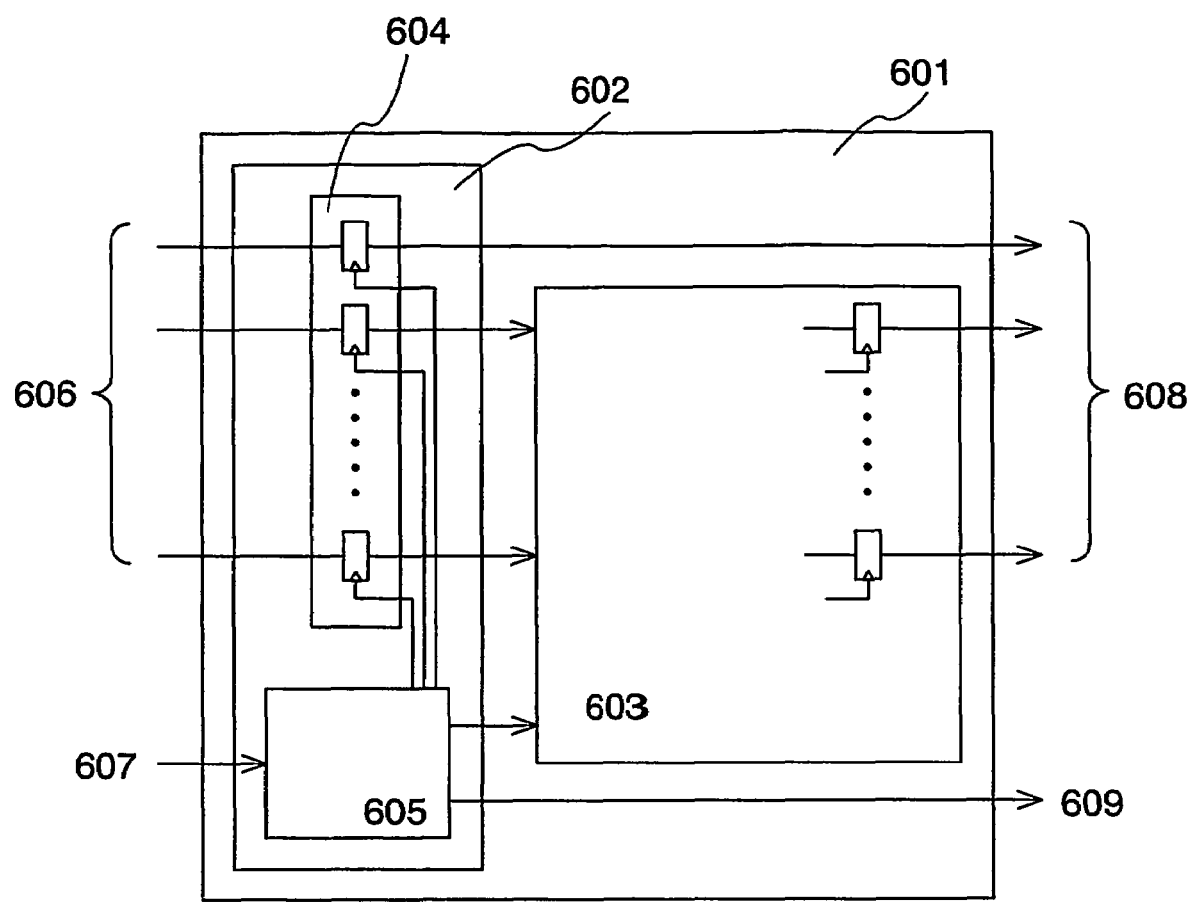
FIG. 6 is a block diagram showing a logic block constituting a semiconductor integrated circuit of the invention.

FIG. 6 is a block diagram of a logic block with such a structure. In FIG. 6, input data 606, an input control signal 607, output data 608, and an output control signal 609 are input to or output from a logic block 601. The logic block 601 is constituted by a first logic circuit 602 including a first group of registers 604 and a control circuit 605, and a second logic circuit 603.

A feature of the logic block 601 shown in FIG. 6 is that the input data 606 is directly input to the first group of registers 604. According to such a structure, the first logic circuit 602 can be simplified and the circuit scale can be reduced, resulting in improved accuracy of timing verification in the first design step. As a result, malfunctions due to the first design step can be reduced.

It is to be noted that this embodiment can be applied to Embodiment 1 as well. That is, it is also efficient that input data is directly input to the third group of registers in a logic sub-block.

EMBODIMENT 3

As a circuit structure for reducing the cases in which a malfunction due to the first design step requires the correction of an entire chip, a structure example in which a control signal in a logic block is controlled independently of other logic blocks and timing adjustment can be performed within each logic block may be adopted.

Figure 7A:
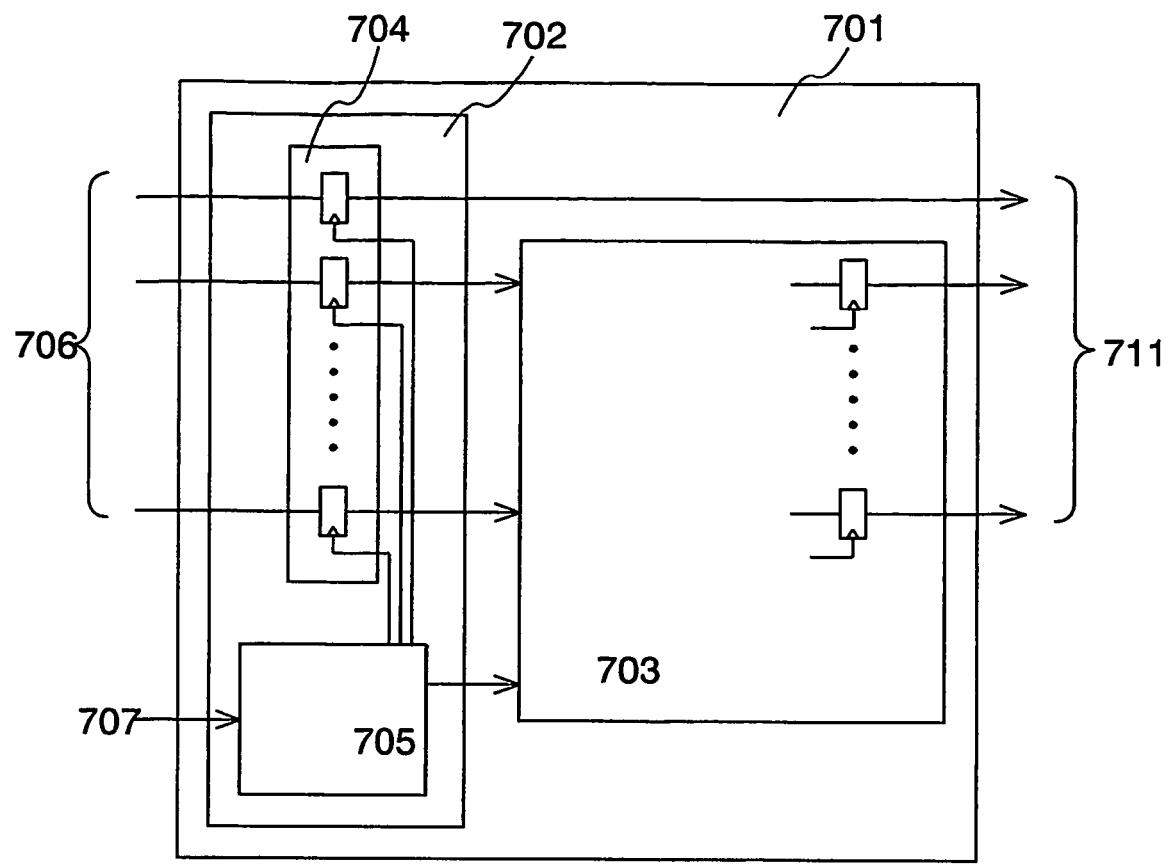
FIGS. 7A and 7B are block diagrams each showing a logic block constituting a semiconductor integrated circuit of the invention.
Figure 7B:
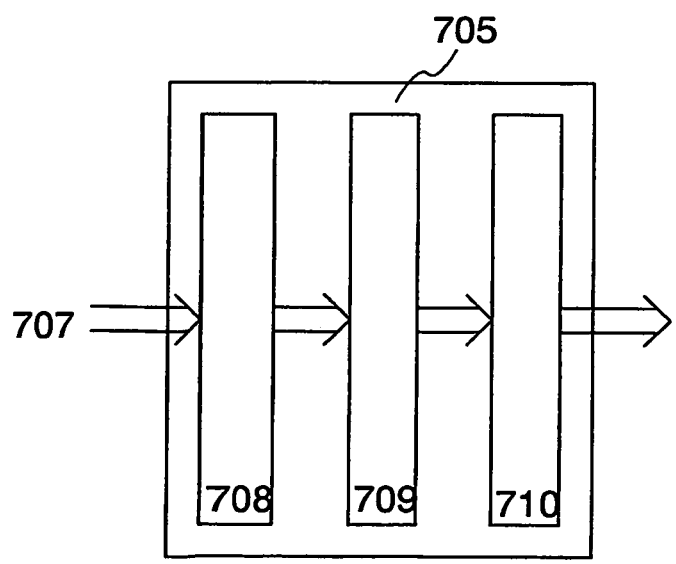

FIGS. 7A and 7B are block diagrams of a logic block with such a structure. In FIG. 7A, input data 706, an input control signal 707, and output data 711 are input to or output from a logic block 701. The logic block 701 is constituted by a first logic circuit 702 including a first group of registers 704 and a control circuit 705, and a second logic circuit 703. FIG. 7B shows a structure example of the control circuit 705. The input control signal 707 is output through a timing adjustment circuit 708, a control signal generating circuit 709, and a timing adjustment circuit 710. For instance, it can be considered that the timing adjustment circuit 708 is a circuit for adjusting the timing between logic blocks whereas the timing adjustment circuit 710 is a circuit for adjusting the timing within each logic block. These timing adjustment circuits 708 and 710 are constituted by a delay circuit and the like.

A feature of the logic block 701 shown in FIG. 7A is that an output control signal is not provided and the control circuit 705 has a function of adjusting the timing. When adopting a structure that does not output a control signal from the logic block, delay of the control signal does not affect a plurality of blocks. In order to achieve such a structure, a logic block using a control signal generated in other logic blocks may make a copy of a logic circuit for generating the control signal. In addition, when adopting a structure in which timing adjustment can be performed in each logic block, a malfunction in the first group of registers may be corrected only by correcting the timing adjustment circuit.

As a result, the number of cases in which a plurality of blocks are required to be corrected is reduced, and it is more likely that a malfunction can be corrected only by modifying the layout of the first logic circuit including the first group of registers.

It is to be noted that this embodiment can be applied to Embodiment 1 as well. That is, it is also efficient in FIG. 5 that each of the logic sub-blocks 510 to 512 does not have an output control signal and the control circuit 513 has a function of adjusting the timing.

Furthermore, this embodiment can be applied to Embodiment 2 as well.

EXPLANATION OF REFERENCES

101: logic block 102: first logic circuit 103: second logic circuit 104: first group of registers 105: logic circuit 106: control circuit 107: input data 108: input control signal 109: output data 110: output control signal 401: semiconductor integrated circuit 402: logic block 402a: first logic circuit 402b: second logic circuit 403: logic block 403a: first logic circuit 403b: second logic circuit 404: logic block 404a: first logic circuit 404b: second logic circuit 405: logic block 405a: first logic circuit 405b: second logic circuit 406: control signal generating circuit 407: data lines 408: control lines 501: logic block 502: first logic circuit 503: second logic circuit 504: first group of registers 505: first group of registers 506: control circuit 507: data lines 509: control lines 510: logic sub-block 511a: third logic circuit 511b: fourth logic circuit 512a: third logic circuit 512b: fourth logic circuit 513: control circuit 514: data lines 515: control lines 601: logic block 602: first logic circuit 603: second logic circuit 604: first group of resistors 605: control circuit 606: input data 607: input control signal 608: output data 609: output control signal 701: logic block 702: first logic circuit 703: second logic circuit 704: first group of registers 705: control circuit 706: input data 707: input control signal 708: output data 709: control signal generating circuit 710: timing adjustment circuit

The invention claimed is:

1. A design method of a semiconductor integrated circuit:
   wherein the semiconductor integrated circuit comprising a plurality of logic blocks comprises:
   first logic circuits each including a first group of registers to which external data is written in a first latching step after the external data is input and a first control circuit for controlling the first group of registers; and
   second logic circuits each including a second group of registers to which the external data is not written in the first latching step and a second control circuit for controlling the second group of registers in accordance with a first output signal from the first logic circuits,
   wherein the design method comprises the steps of:
   first designing layout and timing verification of the first logic circuits and first control lines and first data lines between the plurality of logic blocks; and
   second designing layout and timing verification of one of the second logic circuits.

2. The design method of the semiconductor integrated circuit according to claim 1,
   wherein each of the second logic circuits comprises a plurality of logic sub-blocks comprising:
   third logic circuits each including a third group of registers to which data input to each of the second logic circuits is written in a second latching step after the data is input and a third control circuit for controlling the third group of registers; and
   a fourth logic circuit including a fourth group of registers to which the data input to each of the second logic circuits is not written in the second latching step and a fourth control circuit for controlling the fourth group of registers in accordance with a second output signal from the third logic circuits,
   wherein the second designing layout and timing verification step comprises:
   designing layout and timing verification of the third logic circuits and second control lines and second data lines between the plurality of logic sub-blocks; and
   designing layout and timing verification of the fourth logic circuit.

3. A semiconductor integrated circuit comprising:
   a plurality of logic blocks each comprising:
   a first logic circuit including a first group of registers to which external data is written in a first latching step after the external data is input and a first control circuit for controlling the first group of registers; and
   a second logic circuit including a second group of registers to which the external data is not written in the first latching step and a second control circuit for controlling the second group of registers in accordance with a first output signal from the first logic circuit,
   wherein the first logic circuit and the second logic circuit are disposed separately.

4. The semiconductor integrated circuit according to claim 3,
   wherein the second logic circuit comprises a plurality of logic sub-blocks each comprising:
   a third logic circuit including a third group of registers to which data input to the second logic circuit is written in a second latching step after the data being input and a third control circuit for controlling the third group of registers; and
   a fourth logic circuit including a fourth group of registers to which the data input to the second logic circuit is not written in the second latching step and a fourth control circuit for controlling the fourth group of registers in accordance with a second output signal from the third logic circuit, and
   wherein the third logic circuit and the fourth logic circuit are disposed separately.

5. The semiconductor integrated circuit according to claim 3, wherein the external data is directly input to the first group of registers.

6. The semiconductor integrated circuit according to claim 3,
   wherein each of the logic blocks comprises a circuit for adjusting timing of a generated control signal and the control signal is not output from each of the logic blocks.

7. A design tool of a semiconductor integrated circuit:
   wherein the semiconductor integrated circuit comprising a plurality of logic blocks comprises:
   first logic circuits each including a first group of registers to which external data is written in a first latching step after the external data is input and a first control circuit for controlling the first group of registers; and
   second logic circuits each including a second group of registers to which the external data is not written in the first latching step and a second control circuit for controlling the second group of registers in accordance with a first output signal from the first logic circuits;
   wherein the design tool executes:
   a first design step for designing layout and timing verification of the first logic circuits and first control lines and first data lines between the plurality of logic blocks; and
   a second design step for designing layout and timing verification of one of the second logic circuits.

8. The design tool of the semiconductor integrated circuit according to claim 7,
   wherein each of the second logic circuits comprises a plurality of logic sub-blocks each comprising:
   a third logic circuit including a third group of registers to which a value can be externally written in a second latching step after external data being input and a control circuit for controlling the third group of registers; and
   a fourth logic circuit including a fourth group of registers to which a value cannot be externally written in the second latching step and a control circuit for controlling the fourth group of registers in accordance with an output signal from the third logic circuit, and
   wherein the second design step comprises:
   a third design step for performing layout and timing verification of a logic circuit that includes a signal line between the logic sub-blocks and the third logic circuit; and
   a fourth design step for performing layout and timing verification of the fourth logic circuit in each of the logic sub-blocks independently.

* * * * *